(12) United States Patent
Nakamura

(10) Patent No.: US 7,057,443 B2
(45) Date of Patent: Jun. 6, 2006

(54) TEMPERATURE INDEPENDENT CURRENT SOURCE AND ACTIVE FILTER CIRCUIT USING THE SAME

(75) Inventor: Yoshiaki Nakamura, Kanagawa (JP)

(73) Assignee: NEC Electronics Corporation (JP)

( * ) Notice: Subject to any disclaimer, the term of this patent is extended or adjusted under 35 U.S.C. 154(b) by 307 days.

(21) Appl. No.: 10/664,110

(22) Filed: Sep. 17, 2003

(65) Prior Publication Data
US 2005/0206442 A1    Sep. 22, 2005

(30) Foreign Application Priority Data
Sep. 19, 2002   (JP) .............................. 2002-274112

(51) Int. Cl.
*G05F 3/22*   (2006.01)
(52) U.S. Cl. ...................... 327/540; 327/558; 323/315
(58) Field of Classification Search ..................... None
See application file for complete search history.

(56) References Cited

U.S. PATENT DOCUMENTS

| 6,414,516 B1 * | 7/2002 | Labram et al. ............... 326/83 |
| 6,417,656 B1 * | 7/2002 | Shirai ......................... 323/316 |
| 6,600,304 B1 * | 7/2003 | Kim ............................ 323/315 |

FOREIGN PATENT DOCUMENTS

| JP | 07-321602 | 12/1995 |
| JP | 10-284989 | 10/1998 |

* cited by examiner

*Primary Examiner*—Timothy P. Callahan
*Assistant Examiner*—Terry L. Englund
(74) *Attorney, Agent, or Firm*—Hayes Soloway P.C.

(57) ABSTRACT

A current circuit includes a first group and a second group of transistors whose emitters are connected via respective resistors to a voltage source. The collectors of the first-group of transistors (50, 51) are connected together to an output terminal (43) and those of the second group of transistors (70, 71) are connected together to a current source (74) that produces a constant current (I). The bases of the first and second groups of transistors are connected together to form a current mirror, so that the same constant current is drawn by the first group of transistors to the output terminal. From the output terminal, a current inversely variable with uniform resistance variations is drawn, so that a current supplied from the output terminal is a difference between the constant current and the inversely variable current. The current from the output terminal drives an active filter (10) which includes switching circuits and resistor-capacitor circuitry.

19 Claims, 4 Drawing Sheets

US 7,057,443 B2

TEMPERATURE INDEPENDENT CURRENT SOURCE AND ACTIVE FILTER CIRCUIT USING THE SAME

BACKGROUND OF THE INVENTION

1. Field of the Invention

The present invention relates generally to active filter circuits and more specifically to active filter circuit driven by a constant current circuit.

2. Description of the Related Art

A typical active filter circuit includes a Gm-C filter which is driven by a reference current supplied from a constant current source. Usually, the active filter circuit is formed on a common semiconductor substrate. Due to temperature drift or variability of manufacturing process, all resistors of the substrate are uniformly affected so that their resistance values deviate from their rated values. This results in the reference current varying in a direction opposite to the direction of deviation of all resistors. The effect of the varying reference current is combined with a resistance deviation that occurs in the active filter and causes a deviation of its cut-off frequency from the desired frequency.

Japanese Patent Publication 1998-284989 discloses an active filter circuit which includes a temperature-compensation current source as an extra power supply unit of main DC power source. Currents produced by the DC power source and the extra power supply unit are combined to drive a Gm-C filter. By varying the input current of the Gm-C filter according to temperature drift, the cut-off frequency of the filter is kept constant. However, the use of the extra power unit for temperature compensation requires the circuit designer to estimate all possible temperature variations and prepare reference test data based on the estimated temperature variations. The reference test data is used to adjust the output current of the extra power unit corresponding to the estimated temperature variations. While this prior art is satisfactory if the estimated temperature variations are accurate, the disclosed technique is limited for a particular type of filter. Furthermore, the prior art is incapable of compensating for the uniformly drifted variations of resistors caused by variability of manufacturing process.

Japanese Patent Publication 1995-321602 discloses a time-constant control circuit which forms part of an active filter. The time-constant control circuit is formed by a pair of transistors and a resistor coupled between the emitters of the transistors. Two current sources are respectively connected to the transistors. One of the transistors has its base biased at a reference voltage. A variability detector is provided for detecting an RC error caused by variability in the manufacturing process of integrated circuits. Based on the detected RC error, a control voltage is supplied from the variability detector to the base of the other transistor and the current sources. The time-constant control circuit produces a control voltage that renders the transconductance of the active filter unaffected by the RC error.

However, the prior art requires that the variability detector be implemented with a Gilbert multiplication circuitry which adds to the size and complexity of the integrated circuit.

SUMMARY OF THE INVENTION

It is therefore an object of the present invention to provide a simple yet effective solution for compensating for uniformly drifting variations of resistors of an active filter circuit formed on a common semiconductor chip, regardless of varying temperature and variability of manufacturing process.

A further object of the present invention is to provide a constant current circuit which can be universally used with an active filter for compensating for uniformly drifting variations of resistors of the active filter and the constant current source formed on a common semiconductor chip.

According to one aspect of the present invention, there is provided a constant current circuit including a plurality of resistors formed on a semiconductor substrate, comprising a first current source for producing a first current of constant magnitude regardless of resistance variations which can occur uniformly in the resisters, and a second current source for producing a second current of magnitude which is inversely variable with the resistance variations. The first and second current sources are connected to each other for producing an output current which is equal to a difference between the first and second currents.

According to a second aspect, the present invention provides a constant current circuit including a plurality of resistors formed on a semiconductor substrate. The constant current circuit comprises a first group of parallel transistors having emitters connected via respective resistors to a voltage source and having collectors connected together to an output terminal, a second group of parallel transistors having emitters connected via respective resistors to the voltage source and having collectors connected to each other, a constant current source connected between the collectors of the second group of transistors and ground to produce a constant current. The first and second groups of transistors have their bases connected together to form a current mirror, whereby a current equal to the constant current is drawn by the first group of transistors to the output terminal. Transistor-resistor circuitry is provided for drawing a current inversely variable with uniform resistance variations of the semiconductor substrate from the output terminal to ground.

According to a third aspect, the present invention provides an active filter circuit having a plurality of resistors formed on a semiconductor substrate, comprising a first current source for producing a first current of constant magnitude regardless of resistance variations which can occur uniformly in the resistors, a second current source for producing a second current of magnitude which is inversely variable with the resistance variations, the first and second current sources being connected to each other for producing an output current which is equal to a difference between the first and second currents, and an active filter driven by the output current for filtering an input signal.

According to a fourth aspect, the present invention provides an active filter circuit having a plurality of resistors formed on a semiconductor substrate. The active filter circuit comprises a first group of parallel transistors having emitters connected via respective resistors to a voltage source and having collectors connected together to an output terminal, a second group of parallel transistors having emitters connected via respective resistors to the voltage source and having collectors connected to each other, and a constant current source connected between the collectors of the second group of transistors and ground to produce a constant current, the first and second groups of transistors having their bases connected together to form a current mirror, whereby a current equal to the constant current is drawn by the first group of transistors to the output terminal. Transistor-resistor circuitry is provided for drawing a current inversely variable with uniform resistance variations of the semiconductor substrate from the output terminal to ground. Further provided are a pair of switching circuits which are driven by the output current for alternately assuming a conducting state according to polarity of an input signal, and resistor-capacitor circuitry connected across the switching circuits to produce a filtered output signal.

BRIEF DESCRIPTION OF THE DRAWINGS

The present invention will be described in detail further with reference to the following drawings, in which.

DETAILED DESCRIPTION

Figure 1:
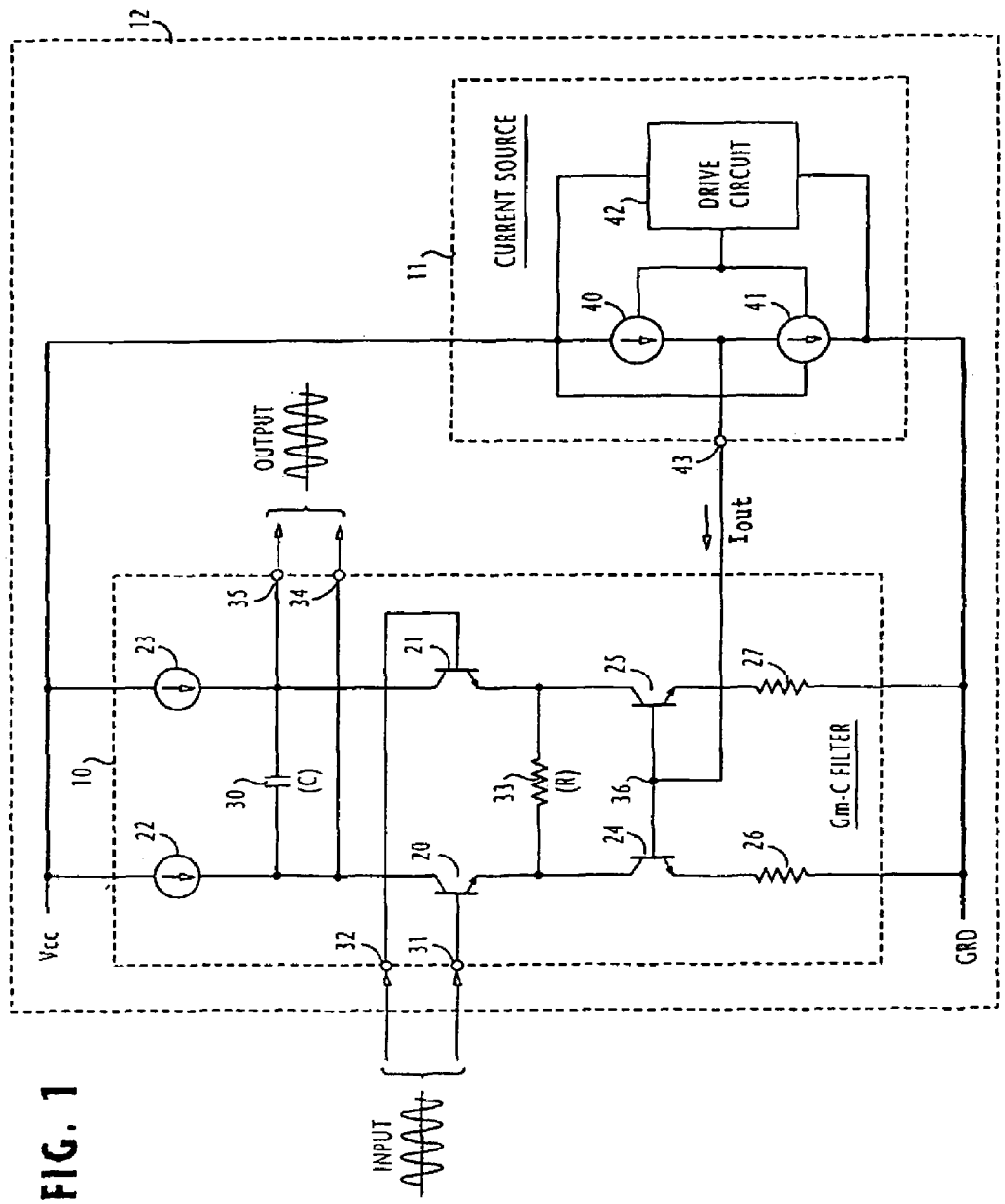
FIG. 1 is a circuit diagram of an active filter circuit incorporating a constant current source of the present invention.

In FIG. 1, the active filter circuit of the present invention is comprised of a Gm-C filter 10 and a constant current source 11, both of which are integrated on a common semiconductor substrate 12. Filter 10 includes a pair of NPN transistors 20 and 21 whose bases are respectively coupled to input terminals 31 and 32 where an input alternating voltage is applied. The collectors of transistors 20, 21, which are connected to the voltage source Vcc via current sources 22 and 23, are ac-coupled by a capacitor 30. The collectors of these transistors 20, 21 are further connected to output terminals 34, 35 from which an output alternating voltage is delivered. The emitters of the transistors 20, 21 are dc-coupled by a resistor 33 and further connected to the collectors of NPN transistors 24, 25, respectively. The bases of transistors 24, 25 are connected to a circuit node 36 and the emitters of transistors 24, 25 are connected to ground via respective resistors 26, 27.

Constant current source 11 of the present invention, which is connected between the voltage source Vcc and ground, includes current sources 40 and 41 and a drive circuit 42 which drives the current sources 40 and 41. A circuit node between the current sources 40 and 41 is connected to an output terminal 43 from which an output current $I_{out}$ is supplied to the circuit node 36 of the active filter 10.

Figure 2:
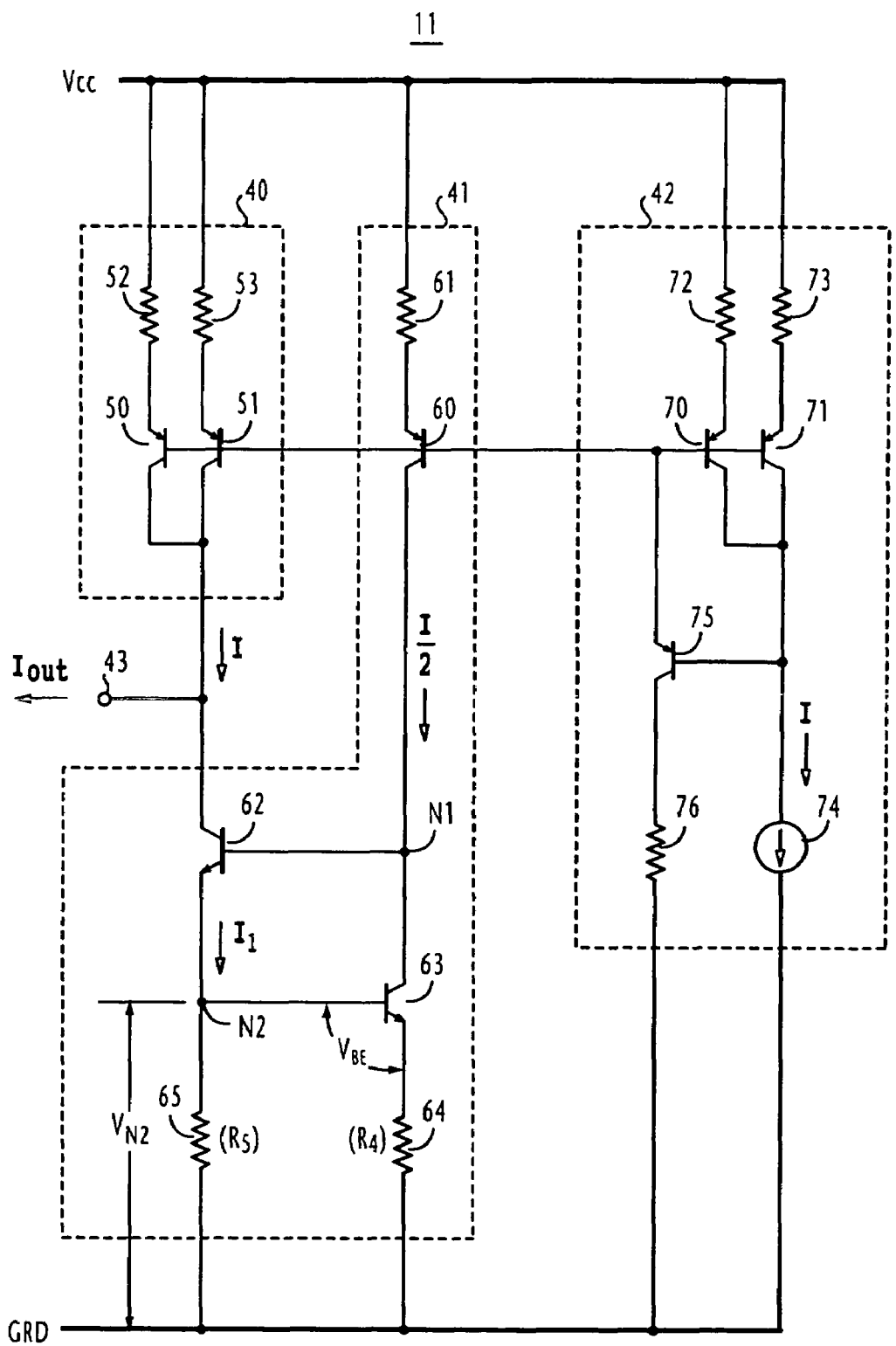
FIG. 2 is a circuit diagram of the constant current source constructed according to a first embodiment of the present invention.

Details of the constant current source 11 of a first embodiment of the present invention are shown in FIG. 2. In this embodiment, the drive circuit 42 drives the current source 40 with a current I×N and drives the current source 41 with a current I×N/M, where M is the number of collector-coupled PNP transistors provided in each of the current source 40 and the drive circuit 42 that form a current mirror and N is the number of transistors provided in the current source 41 that forms part of the current mirror. In the present invention, N and M are assumed to be 1 and 2, respectively.

Current source 40 comprises a pair of PNP transistors 50, 51 whose emitters are respectively connected via resistors 52, 53 to the voltage source Vcc and whose collectors connected together to the output terminal 43. Drive circuit 42 comprises a pair of PNP transistors 70, 71 whose emitters are respectively connected via resistors 72, 73 to the voltage source Vcc and whose collectors are connected together to a current source 74 and to the base of a PNP transistor 75 whose emitter is connected to the bases of transistors 70, 71 and whose collector is connected to ground through a resistor 76.

Current source 74 is formed of resistors. These resistors are provided external to the semiconductor substrate 12 so that current source 74 can deliver a constant current "I", regardless of temperature drift or variability of manufacturing processes which would uniformly affect the resistivity of all the internally provided resistors of the substrate 12.

The bases of PNP transistors 50, 51 of current source 40 and the bases of transistors 70, 71 of driver 42 are connected together to form a current mirror and the PNP transistor 60 forms part of the current mirror by coupling its base to the bases of transistors 50, 51, 70, 71. As a result of the current mirror relation, the same current I is caused to flow through the collector-coupled PNP transistors 50, 51 of current source 40 to the output terminal 43 as the current I drawn through the collector-coupled PNP transistors 70, 71 by the constant current source 74 to ground.

Current source 41 is of a $V_{BE}$-dependent type. Current source 41 includes a PNP transistor 60 whose base is connected to the bases of transistors 50, 51, 70, 71. The emitter of transistor 60 is connected to the voltage source Vcc via a resistor 61 and its collector is connected to a circuit node Ni to which the base of an NPN transistor 62 and the collector of an NPN transistor 63 are connected. The emitter of transistor 62 and the base of transistor 63 are connected together to a circuit node N2 which is grounded via a resistor 65. The collector of transistor 62 is connected to the output terminal 43. The emitter of transistor 63 is connected to ground via a resistor 64.

In the current source 41, the PNP transistor 60 draws a current from the voltage source Vcc to ground via transistor 63 and resistor 64. Since the number of PNP transistors provided in the current source 41 is ½ of the PNP transistors of each half of the current mirror circuit, the current that flows through the node Ni is one-half of the current I.

NPN transistors 62 and 63 cause a current $I_1$ to flow from the output terminal 43 to ground through resistor 65. This current is given by Equation (1).

$$I_1 = \frac{V_{N2}}{R_5} \tag{1}$$

where, $V_{N2}$ is the potential at the circuit node N2 and $R_5$ is the value of resistor 65. Since the potential $V_{N2}$ is expressed as follows:

$$V_N = V_{BE} + \frac{N}{M} I \times R_4 \tag{2}$$

Since N=1 and M=2, Equation (2) is rewritten as:

$$V_{N2} = V_{BE} + \frac{1}{2} I \times R_4 \tag{3}$$

where, $V_{BE}$ is the base-emitter voltage of transistor 63 and $R_4$ is the value of resistor 64. Current $I_1$ is thus given by Equation (4).

$$I_1 = \frac{V_{BE} + \frac{1}{2}I \times R_4}{R_5} \quad (4)$$

Since the output current $I_{out}$ is equal to the difference between I and $I_1$, the following relation holds:

$$I_{out} = I - I_1 = I - \frac{V_{BE} + \frac{1}{2}I \times R_4}{R_5} \quad (5)$$

When the current $I_{out}$ is supplied to the node 36 of active filter 10, the NPN transistors 24 and 25 are turned ON. If an input alternating voltage is applied to the terminals 31 and 32, the NPN transistors 20 and 21 are turned ON and OFF in a complementary fashion depending on the polarity of the input voltage. As a result, when the transistor 20 is ON, it draws a current from the current source 22 to ground through transistor 24 and resistor 26, and when the transistor 21 is ON, it draws a current from the current source 23 to ground through transistor 25 and resistor 27.

If the input voltage is a low frequency signal, the capacitor 30 functions as a high impedance element and its presence can be ignored. Hence, the output terminals 34 and 35 are in an open circuit condition, causing an alternating voltage to appear thereacross. If the input voltage is a high frequency signal, the capacitor 30 functions as a low impedance element. Hence, the output terminals 34 and 35 are in a short-circuit condition, causing no output voltage to appear thereacross. In this way, the active filter 10 operates as a low-pass filter. The cut-off frequency $f_c$ of the low-pass filter is given by Equation (6).

$$f_c = \frac{1}{2\pi\sqrt{C \times \frac{1}{g_m}}} \quad (6)$$

$$g_m = \frac{1}{R + \frac{2 \times V_{cc}}{I_{out}}} \quad (7)$$

where C is the capacitance of capacitor 30, R is the value of resistor 33, and $V_{cc}$ is the power voltage of the voltage source Vcc.

Current $I_1$ of Equation (4) varies inversely with resistance variations which can occur uniformly in all internal resistors of the semiconductor substrate 12 as follows.

If the temperature of semiconductor substrate 12 rises, all resistors on the substrate 12 increase uniformly, and the current $I_1$ of current source 41 decreases, while current I of current source 74 remains unaffected due to the provision of resistors external to the substrate 12. Because of the current mirror relation to the drive circuit 42, the current I drained through the current source 40 to the output terminal 43 is also unaffected. Therefore, the output current $I_{out}$ increases as seen from Equation (5). This increase would cause the transconductance $g_m$ to decrease. However, Equation (7) shows that a concomitant increase in the resistance R (of resistor 33) produces an opposing effect on this decrease. On the other hand, if the temperature of substrate 12 lowers, all of its resistors decrease uniformly and the current $I_1$ increases while the output current $I_{out}$ decreases, tending to increase the transconductance. A concomitant decrease in the resistance R counteracts this increase in transconductance. If the resistance R is appropriately determined in relation to the output current $I_{out}$, such temperature-dependent mutual-conductance variations can be completely nullified, so that the cut-off frequency $f_c$ can be maintained constant under a varying temperature.

Active filter 10 and the constant current source 11 cooperate in much the same way when all the internal resistors of the substrate 12 are caused to offset uniformly from their nominal values due to variability of manufacturing processes.

The present invention thus eliminates the need to prepare reference measurement data for circuit testing. Therefore, the constant current source 11 of the present invention can be universally used with various active filters.

Figure 3:
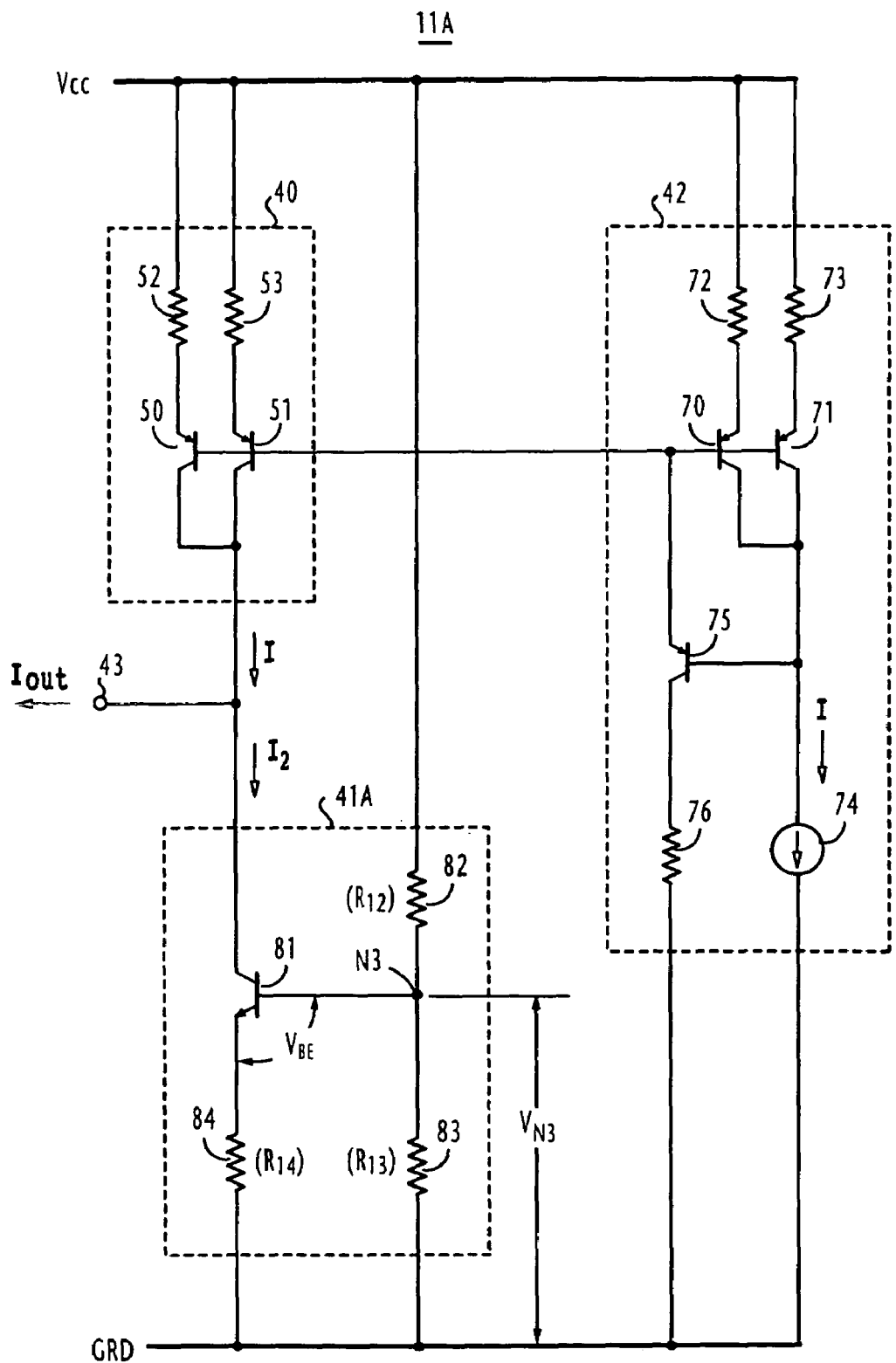
FIG. 3 is a circuit diagram of the constant current source constructed according to a second embodiment of the present invention.

A constant current source 11A, shown in FIG. 3, is a second embodiment of the present invention. This embodiment differs from the previous embodiment in that it replaces the $V_{BE}$-dependent type current source 41 with a $V_{CC}$-dependent type current source 41A.

Current source 41A includes an NPN transistor 81 whose collector is connected to the output terminal 43. The base of transistor 81 is connected to a circuit node N3 of resistors 82 and 83 connected in series between Vcc and ground. Transistor 81 has its emitter coupled to ground through a resistor 84. The potential at node N3 is given by Equation (8) and the transistor 81 draws a current $I_2$ from the output terminal 43 to ground. Current $I_2$ is given by Equation (9).

$$V_{N3} = \frac{R_{13}}{R_{12} + R_{13}} \times V_{cc} \quad (8)$$

$$I_2 = \frac{V_{N3} - V_{BE}}{R_{14}} = \frac{R_{13} \times V_{cc}}{(R_{12} + R_{13})R_{14}} - \frac{V_{BE}}{R_{14}} \quad (9)$$

where, $R_{12}$, $R_{13}$ and $R_{14}$ represent the resistances of resistors 82, 83 and 84, respectively, and $V_{BE}$ is the base-emitter voltage of transistor 81. Therefore, the output current $I_{out}$ is obtained as follows:

$$I_{out} = I - I_2 = I - \left\{ \frac{R_{13} \times V_{cc}}{(R_{12} + R_{13})R_{14}} - \frac{V_{BE}}{R_{14}} \right\} \quad (10)$$

It is seen from Equations (9) and (10) that when all resistors of the substrate 12 uniformly increase, current $I_2$ decreases and output current $I_{out}$ increases, and when all resistors uniformly decrease, current $I_2$ increases and output current $I_{out}$ decreases. The cut-off frequency of the filter 10 is thus maintained constant.

Figure 4:
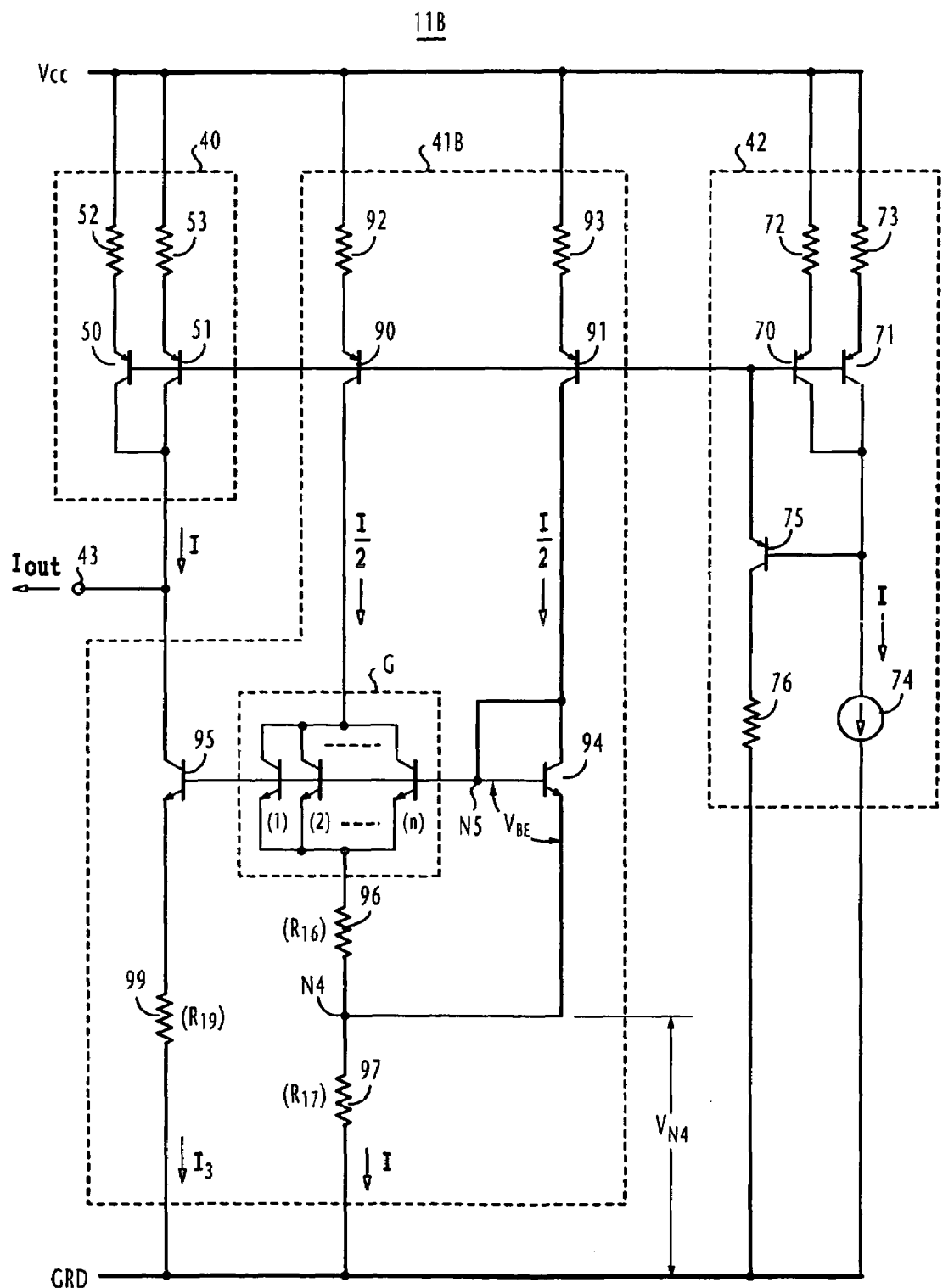
FIG. 4 is a circuit diagram of the constant current source constructed according to a third embodiment of the present invention.

A constant current source 11B, shown in FIG. 4, is a third embodiment of the present invention, which differs from the first embodiment in that it replaces the $V_{BE}$-dependent type current source 41 with a band-gap type current source 41B.

Current source 41B includes a pair of PNP transistors 90 and 91 having their base connected to the bases of current-mirror transistors 50, 51, 70, 71, and having their emitters connected to Vcc via resistors 92 and 93. The collector of transistor 90 is connected to the collectors of a group G of "n" parallel transistors of NPN conductivity, while the collector of transistor 91 is coupled to a circuit node N5 to which the collector of an NPN transistor 94 are also connected.

The emitters of transistor group G are connected together to a point which is connected through resistors 96 and 97 to ground, while the emitter of transistor 94 is connected to a circuit node N4 which is formed between the resistors 96 and 97. Current source 41B further includes an NPN transistor 95 whose collector is connected to the output terminal 43, its emitter being coupled through a resistor 99 to ground. The bases of transistors 94, 95 and transistor group G are connected together to the circuit node N5. PNP transistors 90 and 91 constitute a current mirror with the PNP transistors 50, 51, 70 and 71. Since the PNP transistors 90 and 91 have their collectors not coupled together unlike transistors 50, 51 and 70, 71, one-half of the current I is drawn through each of the transistors 90 and 91 to the circuit node N4, where these currents are summed to produce a current I through the resistor 97. Therefore, the potentials $V_{N4}$ and $V_{N5}$ at the circuit nodes N4 and N5 are given by Equations (11) and (12), respectively.

$$V_{N4} = I \times R_{17} \tag{11}$$

$$V_{N5} = V_{N4} + V_{BE} = V_{N4} + \frac{I \times R_{16}}{2} + V_{GBE} \tag{12}$$

where, $R_{16}$ and $R_{17}$ are the respective resistances of resistors 96 and 97, $V_{BE}$ is the base-emitter voltage of transistor 94 and $V_{GBE}$ is the base-emitter voltage of the transistor group G.

According to bipolar transistor theory, $V_{GBE}$ of the "n" transistors connected in parallel to transistor 94, is given by Equation (13).

$$V_{GBE} = V_{BE} - V_T \times \ln(n) \tag{13}$$

where, $V_T$ is the volt equivalent of temperature which is expressed as:

$$V_T = \frac{k \times T}{q} \tag{14}$$

where k is the Boltzmann constant, T is the absolute temperature (Kelvin) and q is the electric charge. From Equations (12) and (13), the voltage developed across the resistor 96 is equal to:

$$\frac{1}{2} I \times R_{16} = V_{BE} - V_{GBE} = V_T \times \ln(n) \tag{15}$$

Hence, the potentials $V_{N4}$ and $V_{N5}$ are given by Equations (16) and (17), respectively.

$$V_{N4} = \{2 \times V_T \times \ln(n)\} \times \frac{R_{17}}{R_{16}} \tag{16}$$

$$V_{N5} = V_{BE} + \{2 \times V_T \times \ln(n)\} \times \frac{R_{17}}{R_{16}} \tag{17}$$

The first term of Equation (17), i.e., $V_{BE}$ indicates that the potential $V_{N5}$ varies with a negative temperature characteristic and the second term, i.e., $\{2 \times V_T \times \ln(n)\}$ indicates that it varies with a positive temperature characteristic, which counteracts the negative temperature characteristic of the first term. The potential $V_{N5}$ at the circuit node N5 is thus kept constant regardless of temperature variations. Since current $I_3$, which is drawn by transistor 95 to pass through resistor 99 to ground, is given by:

$$I_3 = \frac{V_{N5} - V_{BE}}{R_{19}} \tag{18}$$

(where, $V_{BE}$ is the base-emitter voltage of transistor 95 and $R_{19}$ is the value of resistor 99), the output current $I_{out}$ of FIG. 4 becomes:

$$I_{out} = I - I_3 = I - \frac{V_{N5} - V_{BE}}{R_{19}} \tag{19}$$

It is seen from Equations (18) and (19) that current $I_3$ varies inversely with resistance variations and the output current $I_{out}$ varies with the resistance variations.

What is claimed is:

1. A current circuit including a plurality of resistors formed on a semiconductor substrate, comprising:
    a first current source for producing a first current of constant magnitude regardless of resistance variations which can occur uniformly in said plurality of resistors; and
    a second current source for producing a second current with a magnitude which varies inversely with said resistance variations of said plurality of resistors,
    said first and second current sources being connected to each other for producing an output current which is equal to a difference between said first and second currents.

2. The current circuit of claim 1, wherein said second current varies depending on a base-emitter voltage of a transistor.

3. The current circuit of claim 1, wherein said second current varies depending on a power-line voltage.

4. The current circuit of claim 1, wherein said second current source includes a band-gap type constant current source.

5. A current circuit including a plurality of resistors formed on a semiconductor substrate, comprising:
    a first group of parallel first transistors having emitters connected via a first subset of said plurality of resistors to a voltage source and having collectors connected together to an output terminal;
    a second group of parallel second transistors having emitters connected via a second subset of said plurality of resistors to said voltage source and having collectors connected to each other;
    a constant current source connected between the collectors of said second group of second transistors and ground to produce a constant current, said first group of first transistors and second group of second transistors have bases connected together to form a current mirror, whereby a current equal to said constant current is drawn by said first group of first transistors to said output terminal; and
    current drawing circuitry for drawing a current inversely variable with uniform resistance variations of said semiconductor substrate from said output terminal to ground.

6. The current circuit of claim 5, wherein said current drawing circuitry comprises:
   at least one third transistor having an emitter connected via one resistor of said plurality of resistors to said voltage source and a collector connected to a circuit node, whereby a current whose magnitude is equal to 1/M of said constant current is drawn by said at least one third transistor to said circuit node, where M is the number of transistors provided in each of said first group of first transistors and said second groups of second transistors;
   a fourth transistor having a collector connected to said output terminal and an emitter connected to ground via another resistor of said plurality of resistors, said fourth transistor having a base electrode connected to said circuit node; and
   a fifth transistor having a collector connected to said circuit node and an emitter connected to ground via an additional resistor of said plurality of resistors, said fifth transistor having a base electrode connected to the emitter of said fourth transistor.

7. The current circuit of claim 5, wherein said current drawing circuitry comprises:
   a pair of resistors of said plurality of resistors connected in series between said voltage source and ground to form a circuit node therebetween; and
   a third transistor having a collector connected to said output terminal and an emitter connected to ground via another resistor of said plurality of resistors, said third transistor having a base electrode connected to said circuit node.

8. The current circuit of claim 5, wherein said current drawing circuitry comprises:
   third and fourth transistors having emitters connected via a third subset of said plurality of resistors to said voltage source and having bases connected together to the bases of said first group of first transistors and said second group of second transistors to produce from each of the third and fourth transistors a current whose magnitude is equal to 1/M of said constant current, where M is the number of transistors provided in each of said first group of first transistors and said second group of second transistors;
   a group of fifth transistors having collectors connected together to the collector of said third transistor, having emitters connected together to ground through series connected resistors a fourth subset of said plurality of resistors to ground and having bases connected to a first circuit node to which a collector of said fourth transistor is connected;
   a sixth transistor having a collector and a base electrode connected together to said first circuit node and having an emitter connected to a second circuit node formed within said fourth subset of resistors; and
   a seventh transistor having a collector connected to said output terminal and an emitter connected to ground via another resistor of said plurality of resistors and having a base electrode connected to said first circuit node.

9. An active filter circuit having a plurality of resistors formed on a semiconductor substrate, comprising:
   a first current source for producing a first current of constant magnitude regardless of resistance variations which can occur uniformly in said plurality of resistors;
   a second current source for producing a second current with a magnitude which varies inversely with said resistance variations of said plurality of resistors, said first and second current sources being connected to each other for producing an output current which is equal to a difference between said first and second currents; and
   an active filter driven by said output current for filtering an input signal.

10. The active filter circuit of claim 9, wherein said active filter is a low-pass filter.

11. The active filter circuit of claim 9, wherein said active filter comprises:
   a pair of switching circuits driven by said output current, said switching circuits alternately assuming a conducting state according to polarity of said input signal applied thereto; and
   output circuitry connected across said switching circuits to produce an output signal.

12. The active filter circuit of claim 9, wherein said second current varies depending on a base-emitter voltage of a transistor.

13. The active filter circuit of claim 9, wherein said second current varies depending on a power-line voltage.

14. The active filter circuit of claim 9, wherein said second current source includes a band-gap type constant current source.

15. An active filter circuit having a plurality of resistors formed on a semiconductor substrate, comprising:
   a first group of parallel first transistors having emitters connected via a first subset of said plurality of resistors to a voltage source and having collectors connected together to an output terminal;
   a second group of parallel second transistors having emitters connected via a second subset of said plurality of resistors to said voltage source and having collectors connected to each other;
   a constant current source connected between the collectors of said second group of parallel second transistors and ground to produce a constant current, said first group of first transistors and second group of second transistors having bases connected together to form a current mirror, whereby a current equal to said constant current is drawn by said first group of transistors to said output terminal; and
   current drawing circuitry for drawing a current, which varies inversely with uniform resistance variations of said semiconductor substrate from said output terminal to ground;
   a pair of switching circuits driven by a resulting output current from said output terminal, said switching circuits alternately assuming a conducting state according to polarity of an input signal applied thereto; and
   output circuitry connected across said switching circuits to produce an output signal.

16. The active filter circuit of claim 15, wherein one of said switching circuits comprises a third transistor and a fourth transistor connected in series between said voltage source and ground, and the other switching circuit comprises a fifth transistor and a sixth transistor connected in series between said voltage source and ground,
   said third and fifth transistors having bases connected together to receive said output current, and said fourth and sixth transistors connected to a pair of input terminals to which said input signal is applied,
   wherein said output circuitry comprises:
   one resistor of said plurality of resistors connected between collectors of said third and fifth transistors; and
   a capacitor connected between collectors of said fourth and sixth transistors for producing said output signal.

17. The active filter circuit of claim 15, wherein said current drawing circuitry comprises:
- at least one third transistor having an emitter connected via one resistor of said plurality of resistors to said voltage source and a collector connected to a circuit node, whereby a current whose magnitude is equal to 1/M of said constant current is drawn by said at least one third transistor to said circuit node, where M is the number of transistors provided in each of said first group of first transistors and said second group of second transistors;
- a fourth transistor having a collector connected to said output terminal and an emitter connected to ground via another resistor of said plurality of resistors, said fourth transistor having a base electrode connected to said circuit node; and
- a fifth transistor having a collector connected to said circuit node and an emitter connected to ground via an additional resistor of said plurality of resistors, said fifth transistor having a base electrode connected to the emitter of said fourth transistor.

18. The active filter circuit of claim 15, wherein said current drawing circuitry comprises:
- a pair of resistors of said plurality of resistors are connected in series between said voltage source and ground to form a circuit node therebetween; and
- a third transistor having a collector connected to said output terminal and an emitter connected to ground via another resistor of said plurality of resistors, said third transistor having a base electrode connected to said circuit node.

19. The active filter circuit of claim 15, wherein said current drawing circuitry comprises:
- third and fourth transistors having emitters connected via a third subset of plurality of resistors to said voltage source and having bases connected together to the bases of said first group of first transistors and said second group of second transistors to produce from each of the third and fourth transistors a current whose magnitude is equal to 1/M of said constant current, where M is the number of transistors provided in each of said first group of first transistors and said second group of second transistors;
- a group of fifth transistors having collectors connected together to the collector of said third transistor, having emitters connected together to ground through a series connected resistors a fourth subset of said plurality of resistors to ground and having bases connected to a first circuit node to which a collector of said fourth transistor is connected;
- a sixth transistor having a collector and a base electrode connected together to said first circuit node and having an emitter connected to a second circuit node formed within said fourth subset of said plurality of resistors; and
- a seventh transistor having a collector connected to said output terminal and an emitter connected to ground via another resistor of said plurality of resistors and having a base electrode connected to said first circuit node.

* * * * *